United States Patent

Radhakrishnan et al.

[11] Patent Number: 5,332,879
[45] Date of Patent: Jul. 26, 1994

[54] METHOD FOR REMOVING TRACE METAL CONTAMINANTS FROM ORGANIC DIELECTRICS

[75] Inventors: Gouri Radhakrishnan, Los Angeles, Calif.; Heinrich G. Müller, Austin, Tex.

[73] Assignee: The Aerospace Corporation, El Segundo, Calif.

[21] Appl. No.: 984,605

[22] Filed: Dec. 2, 1992

[51] Int. Cl.$^5$ .......................................... B23K 26/16
[52] U.S. Cl. ............................ 219/121.69; 219/121.86
[58] Field of Search ...................... 219/121.65, 121.69, 219/121.8, 121.86; 156/646

[56] References Cited

U.S. PATENT DOCUMENTS

| | | | |
|---|---|---|---|
| 4,980,536 | 12/1990 | Asch et al. | 219/121.68 |
| 4,987,286 | 1/1991 | Allen | 219/121.68 |
| 5,037,506 | 8/1991 | Gupta et al. | 156/646 |

Primary Examiner—C. L. Albritton
Attorney, Agent, or Firm—William J. Burke

[57] ABSTRACT

A technique is described for the removal of trace metal contaminants from organic dielectrics such as polyimide. Pulsed ultraviolet radiation is used to remove the contaminants from the dielectric, regardless of their chemical nature, by the process of ablation. The process allows prepatterned bulk metal features to be simultaneously exposed to the pulsed radiation and yet remain unaffected.

15 Claims, 4 Drawing Sheets

METHOD FOR REMOVING TRACE METAL CONTAMINANTS FROM ORGANIC DIELECTRICS

STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

The present invention relates to a method of removing metal contaminants from organic dielectrics in general, and in particular, from polyimide which is typically used in multilevel thin-film interconnect structures for packaging applications.

2. Description of the Prior Art

Polyimide has gained increasing importance as a dielectric material in thin-film multilayer interconnect structures. Such structures are used in high-speed, high-density packaging, especially for main-frame computer applications. In these applications, multiple layers of interconnect metallizations are separated by alternating layers of polyimide whose function is to serve as the electrical isolation between the metal features.

More specifically, a typical substrate used for the above applications generally consists of a ceramic wafer with a spun-on film of polyimide on top of which fine line interconnections consisting of metallization features of Cu, Au, or Al are then patterned. However during the fabrication process, a typical step involves the deposition of reactive metals such as Ti:W, Cr, Ni, or Pd, on the ceramic-polyimide substrate. These metals serve as diffusion barriers, adhesion layers, or catalysts. They however have to be etched away at a later stage in the fabrication process, and although conventional etching techniques such as wet etching and plasma processing can etch away the bulk of these metals, these processes are unable to remove trace metal contaminants that adhere to the surface of the polyimide. Even trace quantities of these metals can severely limit the dielectric performance of the polyimide. It is therefore crucial to remove the contaminants and restore the dielectric performance of the polyimide to levels that are acceptable for packaging applications.

A typical method mentioned in the literature to address this type of problem is that of plasma etching. The technique of plasma etching serves to etch vias in polyimide for multilevel metallization systems. While the method can remove bulk polyimide, it is unsuited for problems that require only a minimal removal of polyimide and a selective removal of metal contaminants in it. For example, U.S. Pat. No. 4,357,203 (issued Nov. 2, 1982 to Joseph Zelez and assigned to RCA Corporation) discloses a process for removing the residual film remaining after oxygen plasma etching of polyimide by a second plasma etching utilizing a mixture of argon and hydrogen. While effective in removing residual polyimide under masked conditions, the '203 process would not serve to remove polyimide in the presence of gold metallizations, as it would sputter the gold, causing further contamination of the polyimide. If a mask were used to cover the gold in order to prevent sputtering, both the complexity and the cost of this process would be significantly increased.

Another patent, U.S. Pat. No. 4,445,966 (issued May 1, 1984 to Robert J. Carlson and Daniel W. Youngner and assigned to Honeywell Inc.) discusses a method of plasma etching of films containing chromium. The '966 patent discloses the use of fluorine containing compounds and deals strictly with the removal of chromium from silicon substrates. The surfaces of these substrates are entirely different from sensitive polyimide surfaces and therefore the '966 technique dies not teach or suggest a solution to the problem of removal of chromium or any other metal contaminants from polyimide.

Excimer laser bombardment has been used for the removal of non-bound or free-standing particles from solid surfaces. (A. C. Tam, W. Zapka, and W. Ziemlich, "Efficient laser cleaning of small particulates using pulsed laser irradiation synchronized with liquid-film deposition, "SPIE, 1598, 13-18, 1991.) The technique applied by these authors uses excimer laser bombardment of a surface in conjunction with a liquid jet such as that of water. This process differs from the present invention in that it involves a wet process (not a dry one), and requires a complex experimental set-up involving a specially designed pulsed liquid film deposition system. In addition, the process used by these authors specifically addresses the removal of airborne particles and not embedded particles as in the present invention. In a patent by Karl Asch, Joachim Keyser, Klaus Meissner, and Werner Zapka, issued Dec. 25, 1990 and assigned to International Business Machines Corporation (U.S. Pat. No. 4,980,536), airborne particulates of extremely small dimensions (100–1000 nanometers) were removed from the type of silicon membrane masks that are used primarily in electron beam lithography. The '536 technique uses a mask to selectively expose desired areas of the substrate. In addition, the '536 technique involves the removal of airborne particles (not embedded contaminants) and addresses an application that is quite specific to lithographic masks. This is quite different from the approach of the present invention that teaches a technique to selectively target a single material on a multi-component substrate, based upon the differences in ablation thresholds of each component, thereby excluding the need for a mask.

Excimer laser ablation of organic polymers, in particular that of polyimide has drawn tremendous interest for over a decade, resulting in numerous studies. (R. Srinivasan and W. J. Leigh "Ablative photodecomposition: action of far-ultraviolet (193 nm) laser radiation on poly(ethylene terephthalate) films," J. Am. Chem. Soc. 104, 6784–6785, 1982.) (J. E. Andrew, P. E. Dyer, D. Forster, and P. H. Key, "Direct etching of polymeric materials using a XeCl laser," Appl. Phys. Lett. 43, 717–719, 1983.) (R. Srinivasan and B. Braren, "Ablative photodecomposition of polymer films by pulsed far-ultraviolet (193 nm) laser radiation: dependence of etch depth on experimental conditions," J. Polym. Sci. 22, 2601–2609, 1984.) (G. Koren and J. T. C. Yeh "Emission spectra, surface quality, and mechanism of excimer laser etching of polyimide films," Appl. Phys. Lett. 44, 1112–1114, 1984.) (J. H. Brannon, J. R. Lankard, A. I. Baise, F. Burns, and J. Kaufman, "Excimer laser etching of polyimide," J. Appl. Phys. 58, 2036–2043, 1985.) (R. Srinivasan, B. Braren, and R. W. Dreyfus, "Ultraviolet laser ablation of polyimide films," J. Appl. Phys. 61, 372–376, 1987.) The technological importance of excimer laser ablation of polyimide has been realized through applications such as the production of via-holes, (F. Bachmann, "Large scale application for excimer-lasers: via-hole-drilling by photo-ablation," SPIE 1377, 18-29, 1990.) micropatterning of surfaces, (J. H. Brannon, "Micropatterning of surfaces by excimer laser projection," J. Vac. Sci. Technol. B 7, 1064-1071, 1989.) and patterned electroless plating. (H. Niino and A. Yabe, "Positively charged surface potential of polymer films after excimer laser ablation: application to selective-area electroless plating on the ablated films," Appl. Phys. Lett. 60, 2697-2699, 1992.) While demonstrated for applications requiring the bulk removal (several microns) of polyimide, there are no known efforts to use excimer laser ablation for surface cleaning of polyimide and the removal of metal contaminants from it. In yet another invention, U.S. Pat. No. 4,882,200, (issued to Liu and Grubb on Nov. 21, 1989 and assigned to General Electric Company), an excimer laser is employed to pattern electroless plating activator material from polymer and other substrates. In the '200 process, the activator is intentionally deposited on the substrate. Hence it never becomes embedded in it. This is in contrast to the present invention where the contaminants to be removed are embedded in and are part of the substrate. In addition, the '200 technique is not and cannot be used as claimed to selectively remove trace metal contaminants without selectively exposing the polymer. In the present invention, the surface of the contaminated organic dielectric is completely, not selectively, exposed.

It is therefore an object of this invention to selectively remove trace metal contaminants from an organic dielectric using excimer laser ablation in a maskless process not requiring selective exposure of the substrate. Yet another object is to provide process windows that will achieve this result with a minimal removal of the dielectric material. Another object is to leave pre-patterned thin-film metallization features on the surface of the organic dielectric unaffected and intact to enable further processing steps. Another object is to scale up this process for large area applications using, for example, step and repeat processing.

SUMMARY OF THE INVENTION

The present invention provides a maskless method by which trace metal contaminants can be selectively removed from organic dielectrics in general, and from polyimide in particular, while keeping intact the pre-patterned, fine-line thin-film metallization features on the surface. This method makes use of maskless excimer laser ablation and process selectivity is achieved through precisely controlled laser fluences. This invention makes it possible to restore the dielectric properties of an organic dielectric to levels required for high performance dielectric substrates, typically used in advanced packaging technologies. A process window for this surface cleaning technique has been established using a preferred excimer laser wavelength of 193 nm and at an additional laser wavelength of 248 nm.

BRIEF DESCRIPTION OF THE DRAWINGS

The features and advantages of the invention summarized above will be more fully understood by the following detailed description taken in conjunction with the accompanying drawings in which.

DETAILED DESCRIPTION OF THE INVENTION

In advanced microelectronic packaging, one is often faced with a very general situation of having fine line patterned metallizations on top of an isolating dielectric. The metallization features are designed to conduct high frequency electrical signals to and from different microelectronic systems, for example from IC chips. The isolation between these metal features is crucial for the functionality of the assembled microelectronic system. So called Tape-Automated-Bonding (TAB) tapes and multi-chip module substrates may serve as examples.

The metallizations are produced by various thin film manufacturing processes, such as microlithography, sputtering, electroplating, and others. As an undesired side effect of these processes, the surface of the dielectric can become contaminated with trace metals, which will then degrade its electrical isolation resistance. These trace metal contaminants cannot generally be removed by standard chemical procedures, without affecting the pre-patterned metal features.

Figure 1:
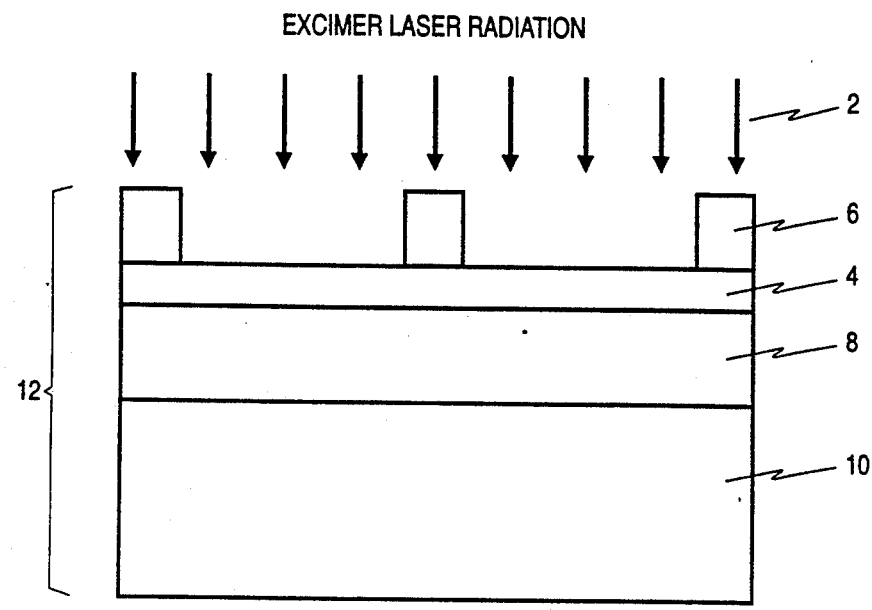
FIG. 1 is a pictorial representation that illustrates how the maskless approach of the present invention is used to simultaneously expose both the contaminated surface as well as the metallizations to excimer laser radiation.

The concept of this invention, as schematically depicted in FIG. 1, is to use short pulses of excimer laser radiation 2 to ablate the contaminated surface layer 4. The pre-patterned metal features 6 are not affected by these laser pulses because they reflect the laser radiation at the selected wavelength and have a higher ablation threshold than the contaminated surface 4 of the organic dielectric 8 on wafer 10. The metal features 6, the contaminated surface 4, the dielectric 8, and the wafer 10 make up substrate 12.

Figure 2:
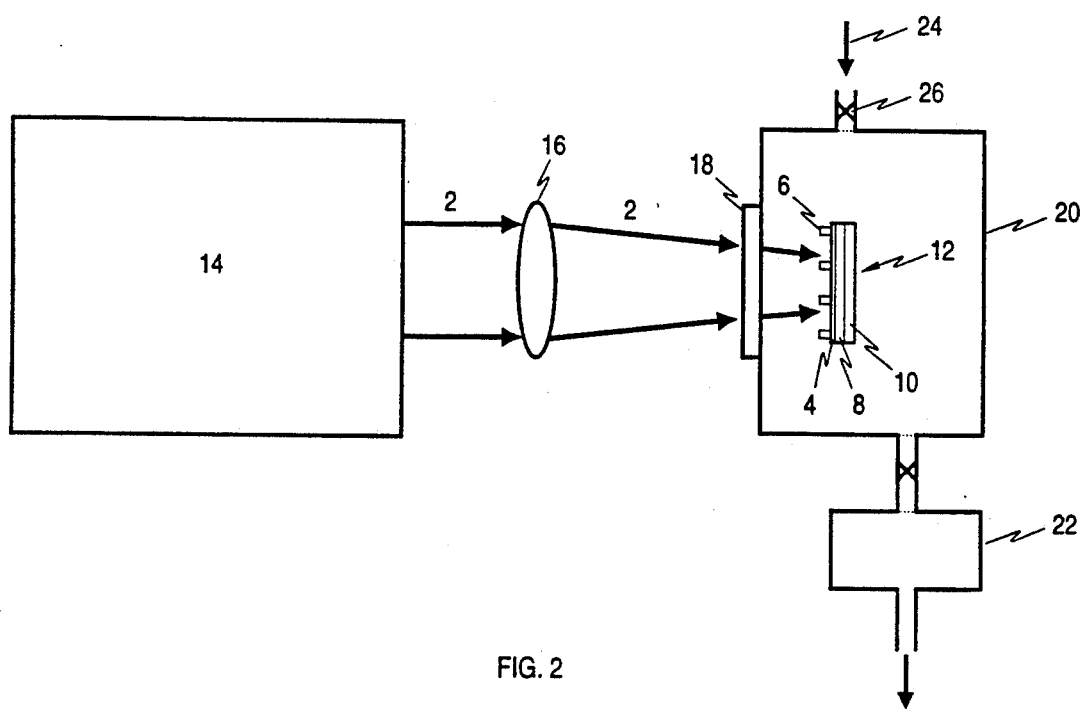
FIG. 2 is a schematic of the experimental set-up.

FIG. 2 depicts the basic set-up for this process. The excimer laser 14 emits pulses of ultraviolet radiation 2, which pass through a simple optical system 16 and a transparent quartz window 18 before striking the substrate 12. The optical system 16 serves to image or concentrate the laser pulses on an area of the substrate 12, sized such that the incident laser fluence is sufficient to ablate the contaminated surface 4 of a dielectric 8 on wafer 10 and is yet low enough to leave intact and unchanged the metal features 6. It is obvious to those skilled in the art that the optical system 16 may be varied depending on the properties of the organic dielectric 8, the excimer laser 14, or other process subtleties.

To ensure the proper removal of the ablation products, the substrate is located in a vacuum chamber 20, which can be evacuated with a connected vacuum pump 22, or additionally can be back-filled with a specific gas ambient 24 through port 26.

The spot or image of the excimer laser radiation 2 produced on the substrate 12 by the optical system 16 may or may not cover the entire contaminated surface 4 to be cleaned. In the latter case, the substrate 12 is stepped or translated once a region is cleaned, in order to then successively expose a new contaminated region to the laser beam. With such a step-and-repeat process, cleaning of the entire substrate surface can be achieved.

EXAMPLE I: (193 nm)

The substrate consisted of 15 μm thick polyimide layers on ceramic substrates. Isolated gold features were fabricated on top of the polyimide. The polyimide surface was contaminated with Cr which could not be satisfactorily removed by wet etching. Polyimide could for instance, also be replaced by other organic dielectrics, for example, polymethylmethacrylate (PMMA) or Parylene.

A Questek laser (model 2560 vβ) was used in this example. Excimer laser radiation at 193 nm was obtained with a prescribed mixture of fluorine with argon, using neon as the buffer gas. The central portion of the 2.5 cm × 1 cm excimer beam was selected by a slit and then concentrated on the substrate using a S1 UV grade lens. The focal length of the lens was appropriately selected to achieve different laser spot sizes on the substrate, thereby resulting in different incident fluences. A sufficiently high range of fluences was produced by power locking the laser at various initial powers. Furthermore, for achieving the low fluence regime (between 20 and 70 mJ/cm$^2$), either a 50% or a 17% transmitting beam-splitter was employed. In this and all the following experiments, the repetition rate of the laser was maintained at 1 Hz to minimize heating of the polyimide surface. The ablations were conducted in vacuum to avoid debris and soot formation that can deposit on the substrate, and in particular on the gold pads. Different levels of vacuum could be achieved by the use of either a roughing pump alone or a turbomolecular pump in conjunction with it. As an alternative to the vacuum environment, an atmosphere of He at pressures in the range of 10 to 760 Torr could be employed.

Figure 3A:
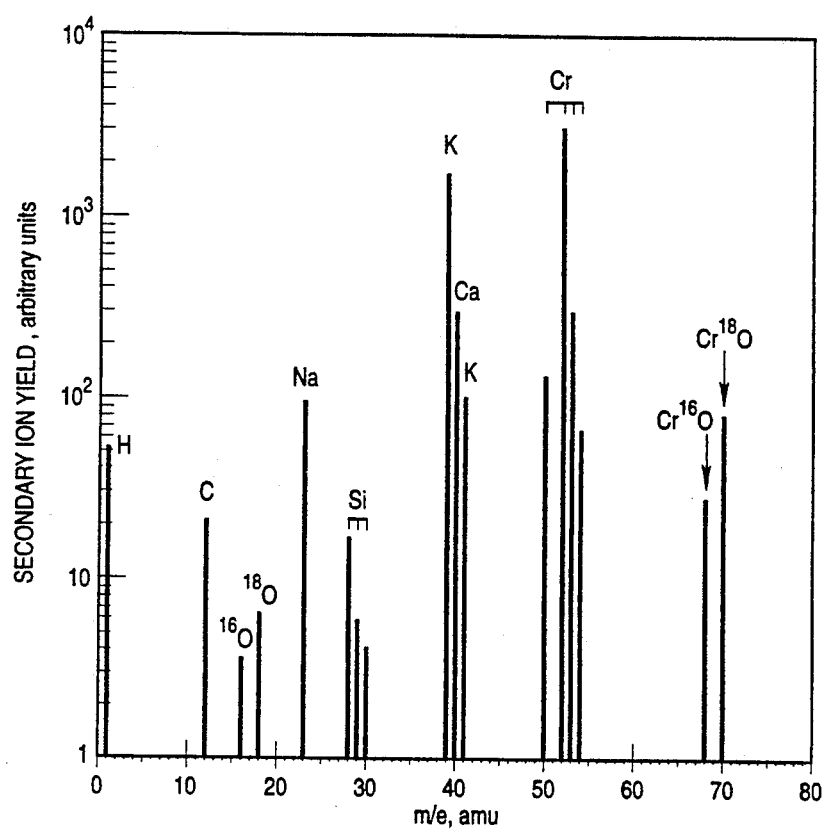
FIG. 3(a) shows the results of an analysis of the contaminated surface of polyimide as measured by Secondary Ion Mass Spectrometry (SIMS).
Figure 3B:
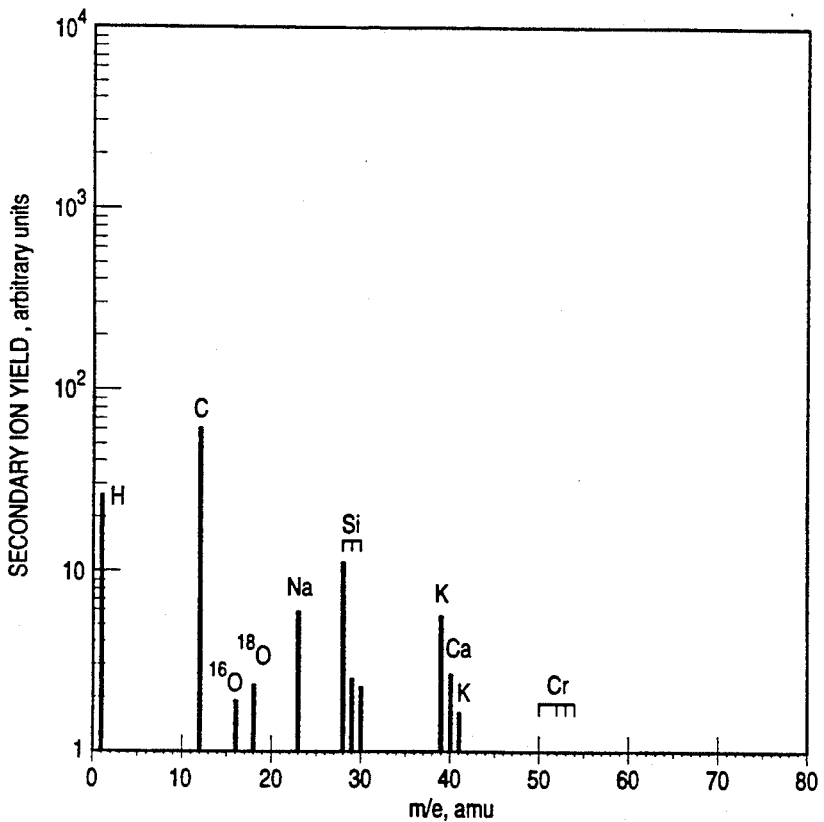
FIG. 3(b) shows the results of a similar analysis of the surface of the polyimide, of FIG. 3(a), following exposure of this surface to 80 pulses of excimer laser radiation at 193 nm, at a fluence of 40 mJ/cm$^2$.

Following ablation at any given fluence, surface analysis was performed using SIMS. This analytical technique was specifically chosen because of its very high sensitivity. X-ray photoelectron spectroscopy (XPS) was used to calibrate the initial levels of Cr contamination on these substrates. However, due to the limited detection capability of XPS to roughly 1% levels of Cr, the more sensitive SIMS technique was applied. FIG. 3 shows the surface analysis of a selected area of contaminated polyimide, before and after the above described treatment with excimer laser radiation at 193 nm. FIG. 3(a) shows the results of SIMS analysis of a contaminated polyimide surface. FIG. 3(b) shows the results of a similar analysis after exposure of this surface to 80 pulses of excimer laser radiation at 193 nm, at an incident fluence of 40 mJ/cm$^2$. This figure clearly reveals the complete removal of Cr on the initially contaminated surface of polyimide.

Figure 4:
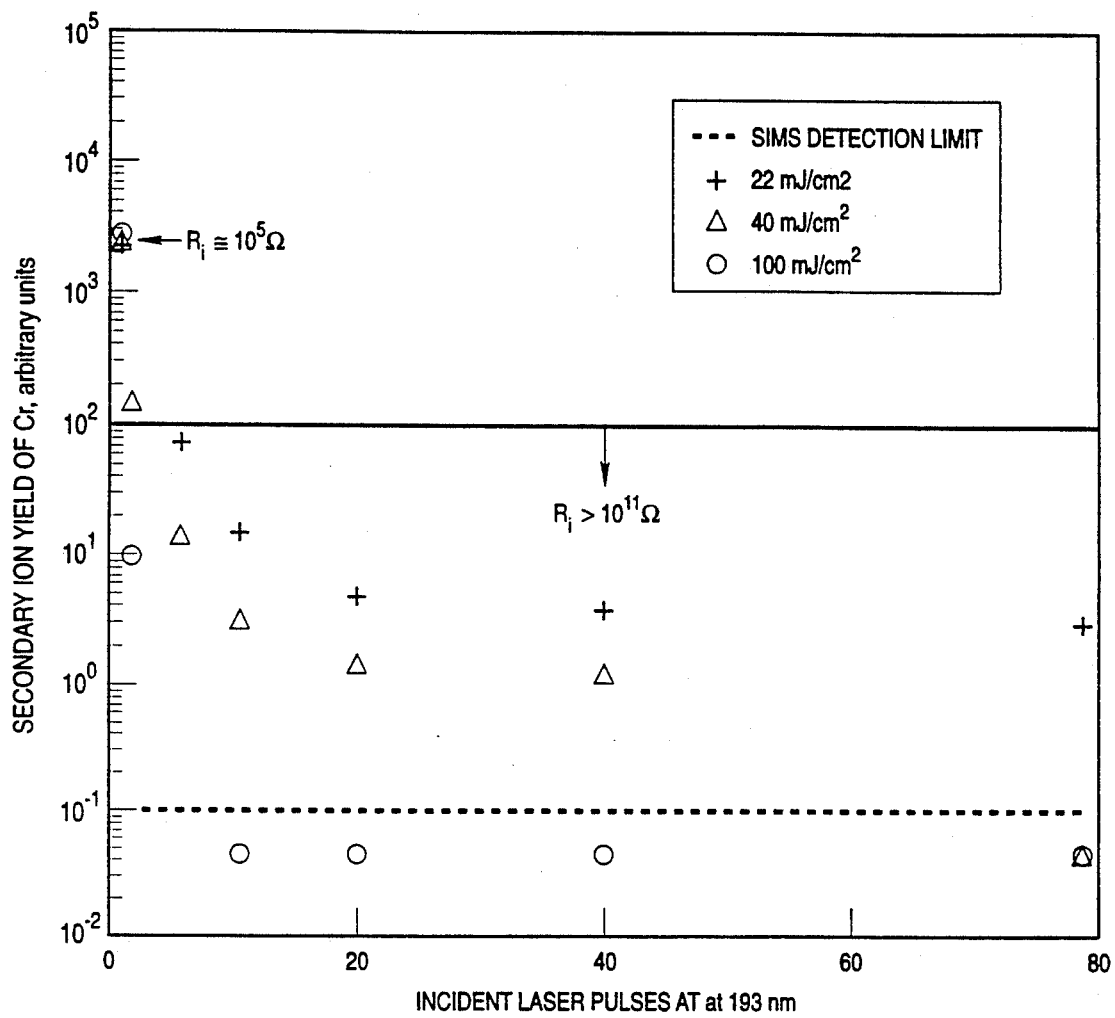
FIG. 4 is a plot showing the decrease in the chromium (Cr) ion signal, as measured by SIMS, as a function of incident laser fluence and number of laser pulses at any given fluence. In addition, the maximum level of Cr contamination allowable for electronic packaging applications, is indicated as established by isolation resistance measurements.

FIG. 4 summarizes the results of 18 tests that were performed at three different incident laser fluences. This figure shows the secondary ion yield of Cr as a function of laser pulses, for fluences of 22, 40, and 100 mJ/cm$^2$ at a wavelength of 193 nm. Also indicated in this figure is the isolation resistance measured on the contaminated polyimide surface (number of laser pulses=0), which corresponds to a value of approximately $10^5$ Ω. In addition, it is observed that at and below contamination levels corresponding to a secondary ion yield of Cr of $10^2$, measured isolation resistances were greater than $10^{11}$ Ω. This result is depicted by the solid line in FIG. 4.

At 193 nm, ablations were carried out in a whole range of incident laser fluences from 20 mJ/cm$^2$, following which ablation rates were calculated. However, an upper limit of 500 mJ/cm$^2$ was placed on the incident fluence in order to prevent any damage to the Au features and thereby insure that further processing steps are not affected. At each fluence, ablation depths were measured as a function of the number of pulses using a Sloan Dektak 3030 stylus profilometer. The ablation rate was calculated from the slope of the least squares fit of the plot of ablation depth versus the number of pulses. At an incident fluence of 40 mJ/cm$^2$, the ablation rate at 193 nm was 250 Å/pulse, while at an incident fluence of 100 mJ/cm$^2$, the ablation rate was 515 Å/pulse. These values clearly indicate that there is no significant removal of the polyimide under these conditions. For those skilled in the art, it will be clear that the number of laser pulses should be kept as small as possible, as this will serve to both minimize ablation depths and reduce processing times.

In most cases, it is preferable to minimize the ablation depth of the organic dielectric to be cleaned. In such cases, our preferred embodiment suggests exposing the contaminated polyimide surface to up to 10 pulses of excimer laser radiation at 193 nm, at an incident fluence in the range of 22 to 100 mJ/cm$^2$.

EXAMPLE II: (248 nm)

Figure 5A:
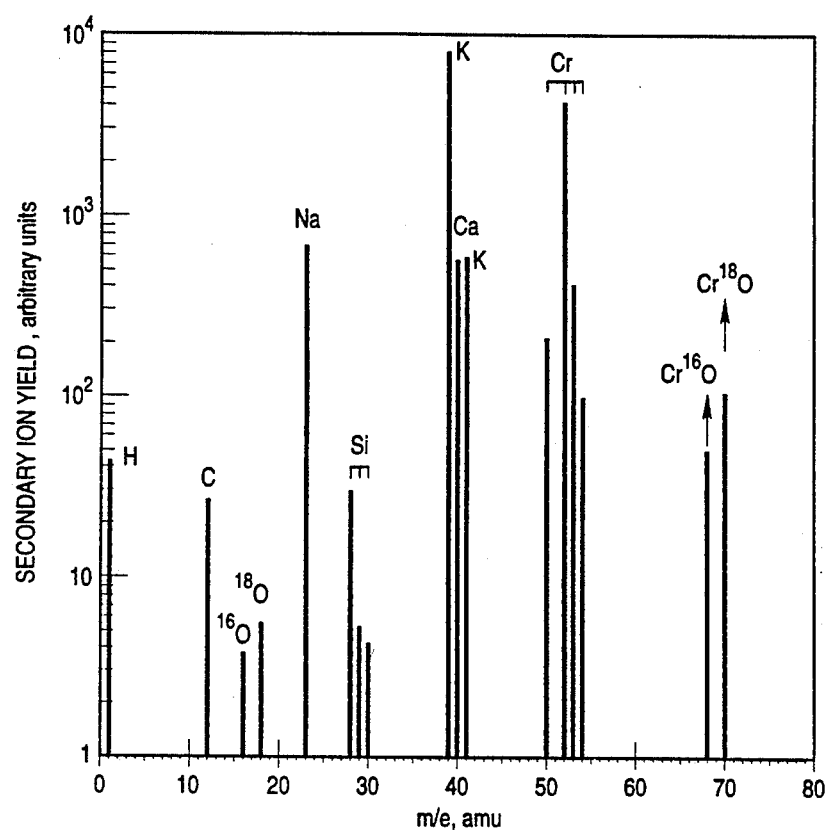
FIG. 5(a) shows the results of an analysis of the contaminated surface of polyimide (using a different sample than in 3(a)) as measured by SIMS.
Figure 5B:
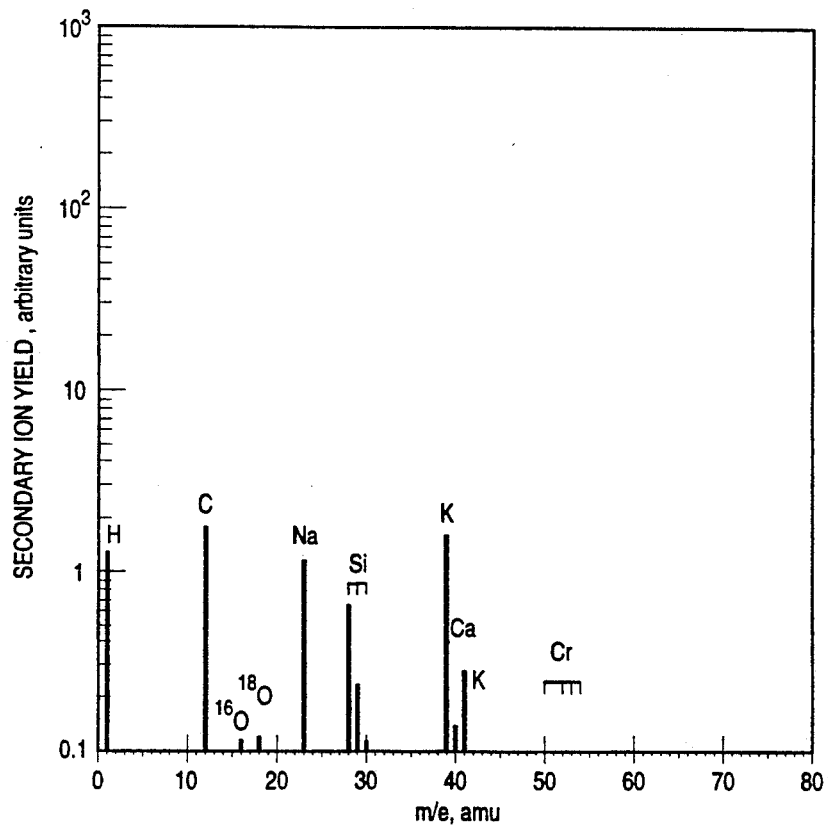
FIG. 5(b) shows the results of a similar analysis of the surface of the polyimide, of FIG. 5(a), following exposure of this surface to 40 pulses of excimer laser radiation at 248 nm, at a fluence of 80 mJ/cm$^2$.

Results similar to those described at 193 nm and shown in FIGS. 3(a) and 3(b) were obtained at 248 nm. Shown in FIG. 5(a) are the results of surface analysis, using SIMS, of yet another sample of contaminated polyimide. FIG. 5(b) depicts the results after exposing the contaminated sample to 40 pulses of excimer laser radiation at 248 nm, at an incident fluence of 80 mJ/cm$^2$. Once again it can be seen that the removal of Cr contaminants can also be achieved using 248 nm radiation, although slightly higher fluences, than at 193 nm, are required.

The advantages of this invention are several. Most importantly, it employs a maskless process which will reduce processing costs significantly. The invention provides a method for removing trace interface contamination which is far superior to the wet etching process. In addition, this process offers the distinct advantage of being independent of the chemical nature of the contaminant, unlike plasma processing, as it is based on ablating the contaminated material and not on a chemical reaction on the surface. The laser ablation technique is free of chemical processing steps and the vacuum requirements are simple. The method is highly selective between different materials on the same substrate, merely by a variation of incident fluence. As the method depends upon the absorption of ultraviolet radiation by the material being ablated, the process is very well controlled by a precise control of the incident fluence. The high reflectivity of metals such as gold or aluminum, at excimer laser wavelengths, makes them poor absorbers of the excimer laser radiation used in this invention. The allows for the selective ablation of the organic dielectrics with their trace metal contaminants, at fluences that would not damage or ablate these patterned metal features. This gives the excimer laser cleaning method a special advantage over the conventional chemical processes.

Although the invention has been described in terms of a preferred embodiment, it will be obvious to those skilled in the art that many alterations and modifications may be made without departing from the invention. For example, the parameter range of incident fluence and number of laser pulses at a selected wavelength of the laser radiation is relatively wide and is determined by a number of factors such as the organic dielectric, its absorption coefficient at a selected wavelength, the type of contaminant, and the type of bulk metal. Accordingly, it is intended that all such alterations and modifications be included within the spirit and scope of the invention.

We claim

1. A method for selectively removing trace metal contaminants from organic dielectrics, comprising the steps of:
   a. adjusting the fluence of a laser beam to a value that selectively ablates trace metal contaminants on an organic dielectric while leaving intact simultaneously exposed features of bulk metal;
   b. exposing an area of the contaminated organic dielectric to the laser beam, thereby causing the removal of the trace metal contaminants.

2. The method claimed in claim 1 in which said laser is a pulsed laser.

3. The method claimed in claim 1 in which said laser is an excimer laser.

4. The method claimed in claim 1 in which said laser is selected from the group consisting of ArF and KrF lasers.

5. The method claimed in claim 1 wherein the organic dielectric is selected from a group consisting of polyimide, PMMA, and Parylene.

6. The method claimed in claim 1 wherein the organic dielectric is polyimide.

7. The method claimed in claim 1 wherein the simultaneously exposed features of bulk metal is selected from a group consisting of Au, Cu, and Al.

8. The method claimed in claim 1 wherein the simultaneously exposed features of bulk metal consist of Au.

9. The method claimed in claim 1 wherein laser radiation is from an ArF laser, at a wavelength of 193 nm and at a fluence of 22 to 500 mJ/cm$^2$, and wherein the organic dielectric is polyimide and the bulk metal features are Au.

10. The method claimed in claim 1 wherein laser radiation is from a KrF laser, at a wavelength of 248 nm and at a fluence of 80 to 500 mJ/cm$^2$, and wherein the organic dielectric is polyimide and the bulk metal features are Au.

11. The method claimed in claim 1 wherein the substrate with the organic dielectric is positioned in a chamber that is held under a vacuum.

12. The method claimed in claim 11 wherein the pressure of said vacuum is less than $4 \times 10^{-2}$ Torr.

13. The method claimed in claim 11 wherein the pressure of said vacuum is less than $1 \times 10^{-4}$ Torr.

14. The method claimed in claim 1 wherein the substrate with the organic dielectric is positioned in a chamber which is maintained in He in a pressure range of 10 to 760 Torr.

15. The method claimed in claim 1 wherein the trace metal contaminants are selected from the group consisting of Ti:W, Cr, Ni, and Pd.

* * * * *

UNITED STATES PATENT AND TRADEMARK OFFICE
CERTIFICATE OF CORRECTION

PATENT NO. : 5,332,879
DATED : July 26, 1994
INVENTOR(S) : Gouri Radhakrishnan, Heinrich G. Muller It is certified that error appears in the above-indentified patent and that said Letters Patent is hereby corrected as shown below:

On the title page, assignee should read as follows:
[73] Assignee: The Aerospace Corporation, El Segundo, Calif.
Microelectronics and Computer Technology Corporation, Austin, Texas Signed and Sealed this Seventh Day of March, 1995

Attest:

BRUCE LEHMAN

Attesting Officer         Commissioner of Patents and Trademarks